US010761561B2

(12) United States Patent
Malik et al.

(10) Patent No.: US 10,761,561 B2
(45) Date of Patent: Sep. 1, 2020

(54) ERROR CHECKING FOR PRIMARY SIGNAL TRANSMITTED BETWEEN FIRST AND SECOND CLOCK DOMAINS

(71) Applicant: Arm Limited, Cambridge (GB)

(72) Inventors: Saira Samar Malik, Austin, TX (US); David Joseph Hawkins, Austin, TX (US); Andrew David Tune, Dronfield (GB); Guanghui Geng, Sheffield (GB); Julian Jose Hilgemberg Pontes, Antibes (FR)

(73) Assignee: Arm Limited, Cambridge (GB)

( * ) Notice: Subject to any disclaimer, the term of this patent is extended or adjusted under 35 U.S.C. 154(b) by 111 days.

(21) Appl. No.: 15/989,228

(22) Filed: May 25, 2018

(65) Prior Publication Data

US 2019/0361486 A1   Nov. 28, 2019

(51) Int. Cl.
*G06F 1/12* (2006.01)
*G06F 30/39* (2020.01)

(52) U.S. Cl.
CPC .............. *G06F 1/12* (2013.01); *G06F 30/39* (2020.01)

(58) Field of Classification Search
CPC ............................. G06F 1/12; H03K 19/0075
See application file for complete search history.

(56) References Cited

U.S. PATENT DOCUMENTS

| 8,630,358 B2 | 1/2014 | Maji et al. |
| 2001/0038304 A1 | 11/2001 | Waldie et al. |
| 2009/0199038 A1* | 8/2009 | Sigal ........................ G06F 1/10 |
| | | 713/600 |
| 2017/0344693 A1* | 11/2017 | Abdul ................. G06F 17/5081 |

OTHER PUBLICATIONS

Extended European Search Report for EP Application No. 19173514.1 dated Oct. 22, 2019, 10 pages.
Y. Li et al, "Synchronization Techniques for Crossing Multiple Clock Domains in FPGA-Based TMR Circuits" *IEEE Transactions on Nuclear Science*, vol. 57, No. 6, Dec. 2010, pp. 3506-3514.

* cited by examiner

*Primary Examiner* — Albert Wang
(74) *Attorney, Agent, or Firm* — Nixon & Vanderhye P.C.

(57) ABSTRACT

An apparatus and method for transmitting signals between two clock domains in which at least one of a phase and a frequency of clock signals in the two clock domains is misaligned. The apparatus includes a first primary interface and a first redundant interface in the first clock domain for receiving a primary signal and a first checking signal respectively, and a second primary interface and second redundant interface in the second clock domain for outputting the primary signal and a second redundant signal respectively. The primary signal and the checking signals are separated by a predetermined time delay and the second checking signal is generated in the second clock domain based on the primary signal. Checking circuitry is provided in the second clock domain to perform an error checking procedure based on the two checking signals and to provide the second checking signal to the second redundant interface.

20 Claims, 9 Drawing Sheets

ERROR CHECKING FOR PRIMARY SIGNAL TRANSMITTED BETWEEN FIRST AND SECOND CLOCK DOMAINS

BACKGROUND

Technical Field

The present technique relates to the field of integrated circuits. More particularly it relates to transmission of a signal between clock domains.

TECHNICAL BACKGROUND

An integrated circuit may have different clock domains which operate in accordance with clock signals for which the phase and/or frequency of the clock signals are misaligned. This can make transmission of clock signals across the clock domain boundary more complex.

SUMMARY

Viewed from one aspect, the present technique provides an apparatus comprising:
a first portion operating in a first clock domain and a second portion operating in a second clock domain;
wherein the first portion comprises a first primary interface and a first redundant interface, the first primary interface being configured to receive a primary signal, and the first redundant interface being configured to receive a first checking signal, the first checking signal and the primary signal being separated by a predetermined time delay; and
wherein the second portion comprises a second primary interface and a second redundant interface, the second primary interface being configured to output the primary signal, and the second redundant interface being configured to output a second checking signal;
the apparatus comprising checking circuitry in the second clock domain configured to:
generate the second checking signal based on the primary signal;
perform an error checking procedure based on the first and second checking signals; and
supply the second checking signal to the second redundant interface said predetermined time delay after the primary signal is supplied to the second primary interface.

Viewed from another aspect, the present technique provides a method for transmitting a primary signal between a first portion operating in a first clock domain and a second portion operating in a second clock domain, the method comprising:
receiving a primary signal at a first primary interface on the first portion, and receiving a first checking signal at a first redundant interface on the first portion, the first checking signal and the primary signal being separated by a predetermined time delay;
outputting the primary signal at a second primary interface on the second portion, and outputting a second checking signal at a second redundant interface on the second portion;
wherein checking circuitry in the second clock domain is configured to:
generate the second checking signal based on the primary signal;
perform an error checking procedure based on the first and second checking signals; and
supply the second checking signal to the second redundant interface said predetermined time delay after the primary signal is supplied to the second primary interface.

Viewed from a further aspect, the present technique provides a computer-implemented method of generating an electronic design file representing a design of an interconnection network for providing data transfer between a plurality of nodes of an integrated circuit; the method comprising:
in response to identifying that the plurality of nodes include a first node operating in a first clock domain and a second node operating in a second clock domain, generating the electronic design file specifying that the interconnection network comprises a clock domain crossing comprising:
a first portion operating in the first clock domain and a second portion operating in the second clock domain;
wherein the first portion comprises first primary interface and first redundant interface, the first primary interface being configured to receive a primary signal, and the first redundant interface being configured to receive a first checking signal, the first checking signal and the primary signal being separated by a predetermined time delay; and
wherein the second portion comprises second primary interface and second redundant interface, the second primary interface being configured to output the primary signal, and the second redundant interface being configured to output a second checking signal;
the apparatus comprising checking circuitry in the second clock domain configured to:
generate the second checking signal based on the primary signal;
perform an error checking procedure based on the first and second checking signals; and
supply the second checking signal to the second redundant interface said predetermined time delay after the primary signal is supplied to the second primary interface.

Further aspects, features and advantages of the present technique will be apparent from the following description of examples, which is to be read in conjunction with the accompanying drawings.

DESCRIPTION OF EXAMPLES

Figure 1:
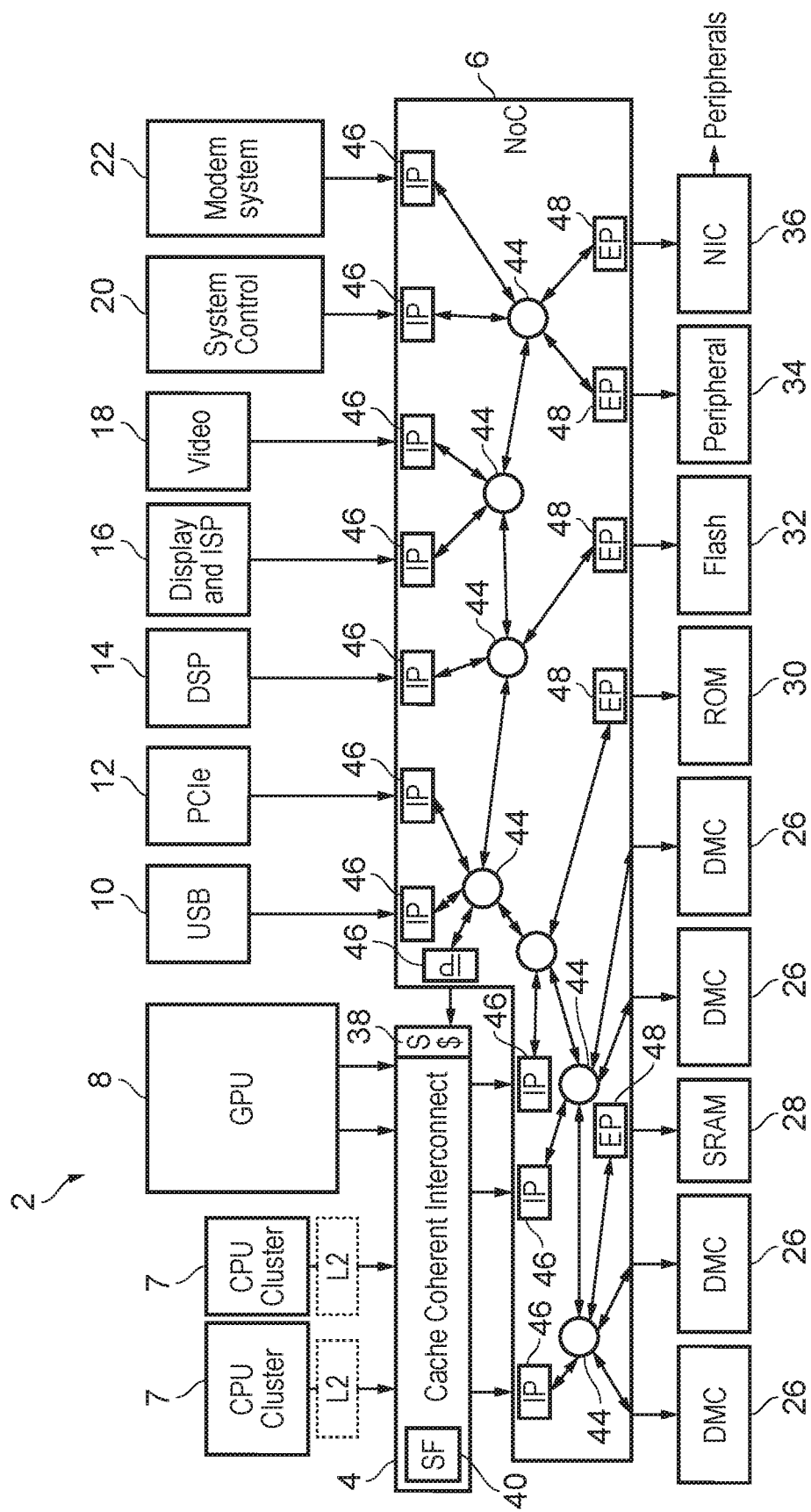
FIG. 1 shows an example of a data processing system having at least one interconnect.

The functional safety of an integrated circuit may be improved by operating components in lockstep, in which the components operate in a redundant manner with a fixed time delay between signals sent between the primary components and corresponding signals sent between the redundant components, and a primary signal and a redundant checking signal are duplicated and compared to one another to check for any errors. The fixed temporal delay between the primary components and redundant components may be zero, or non-zero. A non-zero delay can improve robustness against error as it is less likely that an event at a particular time that causes an error in the primary signal also causes the same error in the checking signal, or vice versa. However, in some cases a fixed time delay of zero can still provide sufficient error detection percentage to comply with some classifications of functional safety required for some applications.

However, such safety features can be difficult to implement in systems with multiple clock domains. In these systems, a "clock domain" may be a collection of components using a single clock signal, and the boundary between two clock domains, which may use clocks having different clock frequencies and/or phases, is called a clock domain boundary. Indeed, in some examples a clock domain crossing becomes necessary because of the implementation of redundant logic in the integrated circuit; due to the increased area of the circuit due to the extra redundant components, the size of the clock domain required to cover a given section of the circuit may become impractical to maintain with a single clock signal. Hence, even if the different portions are intended to operate with the same frequency, they may nevertheless have different phase clocks.

In either case, when a primary signal and a corresponding checking signal (redundant signal) are transmitted across a clock domain boundary via a clock domain crossing, it can be more difficult to maintain the fixed temporal delay between the original signal and its redundant counterpart for checking, causing the lockstep mechanism in the second clock domain to be less effective as the uncertainty in timing at which signals are sampled in the second domain relative to transmission from the first domain can make it harder to reliably compare the primary signal with the correct redundant signal.

In an integrated circuit with multiple clock domains, a clock domain crossing (CDC) may be provided to transmit signals between a first clock domain and a second clock domain, where the clock frequency, the clock phase or both are misaligned between the two clock domains. In some examples, the clock signals in the first and second clock domains are generated independently of each other. In other examples it is possible that both clock signals are generated from a common clock signal, with the practical implementation of the clock tree (a group of clock signals stemming from a single common clock signal) leading to one or both of the signals being modified such that either the phase or the frequency differs between them.

An apparatus (e.g. a CDC for an integrated circuit) may include a first portion in the first clock domain to receive signals and a second portion in the second clock domain to output signals. In the first portion, according to a first example configuration of the present technique, is a first primary interface and a first redundant interface. The first primary interface is arranged to receive a primary signal, while the first redundant interface is configured to receive a first checking signal. The first checking signal is received following a predetermined time delay after the primary signal is received, e.g. with the delay chosen according to the lockstep redundancy mechanisms in place within the first and second clock domains. The first checking signal provides redundancy for the primary signal, and can be compared with the primary components further downstream in the integrated circuit to identify any faults in either the primary signal or the checking signal itself.

In the second portion is a second primary interface and a second redundant interface. The second primary interface is arranged to output the primary signal, so that it can be used by downstream components, while the second redundant interface is arranged to output a second checking signal to be used by downstream components to check for errors in either the primary signal or the checking signal itself.

Also in the second clock domain is checking circuitry configured to generate the second checking signal based on the primary signal once the primary signal has crossed the clock domain boundary. The checking circuitry also receives the first checking signal from the first redundant interface and performs an error checking procedure based on the first and second error checking signals to determine whether one or more errors are present in either the first checking signal or the primary signal. The second error checking signal is provided to the second redundant interface following a time delay equal to the predetermined time delay. It will be appreciated that the predetermined time delay can be any appropriate period of time, including, in some examples, a predetermined time delay of zero.

The fixed time delay used for any lockstep mechanism in the downstream clock domain is therefore recreated in the second clock domain by generating a second checking signal from the primary signal at the checking circuitry and introducing the expected time delay between the primary signal and the second checking signal. This allows any downstream circuitry in the second clock domain to be provided with the primary signal and (second) checking signal separated by the expected time delay even if the clock domain boundary causes uncertainty in the sampling timing of the signals received from the first clock domain. The lockstep error-checking mechanism can therefore be implemented in signals crossing a clock domain boundary, improving the functional safety of the system.

However, this approach is counterintuitive since the second checking signal potentially includes any errors present in the primary signal once it has crossed the clock domain boundary, therefore preventing the errors from being identified by downstream components. However, by performing an error checking procedure based on the first and second checking signals, the checking circuitry can identify any errors present in either checking signal. An indication of whether or not errors were encountered during transmission of the primary signal or first checking signal in the first clock domain can therefore be provided. If an error is detected, a fault handling response can be triggered (such as requesting retransmission of the data).

In some examples, the second primary interface and the second redundant interface are configured to operate with independent, synchronous clocks, meaning that the second primary and redundant interfaces operate using independent clock signals, but that the frequency and phase of these two clock signals are the same. This also applies for the first primary and first redundant interface, which may also operate with independent synchronous clocks (although the clocks used for the first primary/redundant interfaces are not synchronous with the clocks used for the second primary/redundant interfaces). This allows the delay between the primary signal and the checking signal to be maintained at the primary/redundant interfaces, since the delay is based on the number of clock cycles between the two signals and both the primary/redundant interfaces in a given clock domain operate with synchronised clocks.

The apparatus (CDC) may also include a delay buffer in the first clock domain and a compare buffer in the checking circuitry in the second clock domain, the delay buffer being configured to store the first checking signal and the compare buffer being configured to store the second checking signal. The checking circuitry also includes compare circuitry to perform the error checking procedure. The delay buffer and compare buffer are each arranged to store their respective checking signals before passing them to the compare circuitry. These buffers allow the timing of supply of the signals to the compare circuitry for comparison to be decoupled from the relative timing at which signals are sampled in the second domain relative to signals in the first domain, to enable the corresponding signals to be compared with each other across the domain boundary.

The compare circuitry provides a mechanism by which the checking signals can be checked for faults, for example by performing a comparison between the two checking signals and triggering an error handling response if there is a mismatch between them. The compare circuitry may be any circuitry or logic configured to perform a comparison between the two checking signals. The delay buffer and compare buffer are, in some examples, first-in-first-out (FIFO) buffers, and the delay buffer can be a transparent FIFO (sometimes known as a skid FIFO) while the compare buffer may be a compare FIFO. Other forms of buffer may also be used.

The delay buffer can be arranged to store the first checking signal until a signal is received from the compare buffer indicating that the second checking signal is available for comparison with the first checking signal, the delay buffer outputting the first checking signal in response to the signal from the compare buffer. This ensures that the compare circuitry does not prematurely identify a fault due to only one of the two error signals being provided, which may occur due to the mismatch between the phases and/or frequencies of the two clock domains or due to some forms of control error occurring during data transmission (such as errors occurring in control signals which control the location to which signals are routed) which could result in a particular signal being lost in transmission.

In some examples, the compare buffer is arranged to generate and output a "full" signal when all entries in the compare buffer are unavailable (e.g. as all the entries are occupied with signals awaiting comparison). In some cases, the full signal triggers an error handling response, which may include preventing the checking circuitry from performing the error checking procedure, preventing downstream transmission of data, and/or signalling an error to another system component responsible for restarting the system from a safe state, etc. In some examples, the delay buffer also generates a full signal when no entries are available. In this way, the system is able to respond to the compare buffer being full, to signal that safe transmission of further signals may not be guaranteed as there may not be space in the buffer for accommodating further signals.

In some examples, the compare buffer includes at least two entries. In many cases, a two-entry buffer can be sufficient to enable safe transmission across the clock boundary, as the uncertainty in sampling time in the second domain relative to the clock in the first domain may be limited to one of two adjacent clock cycles of the second clock signal, so that the checking signal stored in the compare buffer may often be used within two clock cycles of receipt in the second domain. Using a two entry buffer means that the compare buffer is not unnecessarily large, saving circuit area in the integrated circuit. However, in other examples, the checking signal may not be used within two clock cycles, in which case it is advantageous to provide more than two entries in the compare buffer. Similar considerations may be made with regards to the delay buffer, which may also be designed to comprise either two entries exactly, or more than two entries.

In some examples, the second checking signal is generated by the checking circuitry by copying the primary signal once it has crossed the clock domain boundary. Hence, the primary signal is fully duplicated, providing full redundancy in the checking signal. This allows errors to be easily identified at downstream components simply by comparing the primary signal and the second checking signal and identifying any mismatches between them.

In some examples, the second checking signal is generated by the checking circuitry as an error check code based on a portion of the primary signal, the error check code comprising fewer bits than the portion of the primary signal used in generating it. The error check code can be generated using any error detection scheme including, for example, hash functions such as cyclic redundancy checks or cryptographic hash functions, checksums, or any other form of error checking procedure. Examples of error check codes which may be used also include ECC (error-correcting codes), DED (double error detecting codes) and SECDED (single-error-correcting, double-error-detecting) codes. The portion of the primary signal from which the error check code is derived is, in some examples, all of the bits of the primary signal or, in other examples, only a subset of the bits of the primary signal. The subset of bits used to calculate the error check code may be determined based on the relative importance of some bits over others (e.g. an error in some bits of the primary signal could be less damaging than an error to other bits, so it could be the case that the other bits need more protection from errors). The subset of bits may instead be chosen at random, or may always be the same subset of bits (e.g. always bits 0 to 4, or always bits 5 to 8). Alternatively, some bits of the primary signal may already be protected by other safety mechanisms, and are therefore not selected for inclusion in the error check code.

In a corresponding way, the first checking signal received from upstream circuitry in the first clock domain could be either a fully duplicated version of the primary signal, or an error check code based on a portion of the primary signal.

The primary signal as described above may be a data transmission. The data transmission could be a memory access request sent from an upstream master device to a downstream memory component or peripheral specifying an address of an addressable location to be read or written, or could be a response to such a memory access request sent in the other direction from the downstream component to the upstream master device. Another example of a data transmission is a coherency message, or other types of transactions which may not necessarily require a response. It is often desirable to protect data transmissions between upstream components and downstream components in an integrated chip from errors, in particular when crossing clock domain boundaries where conventional error protection schemes may not be effective, as explained above. It is therefore advantageous to apply the present technique to such data transmissions. A data transmission is typically a string of multiple bits of data passed between components in the system, to be stored in storage locations within or externally to the system, to be used in calculations by components in the system or to be output by the system.

It can be useful to transmit a credit return signal from downstream buffers to upstream buffers, to control transmission timing of a data transmission from the upstream buffer, depending on the expected occupancy of the downstream buffer. Note that such upstream/downstream buffers may not be within the apparatus (CDC) itself, but could be in another part of the integrated circuit. For example, the downstream buffer could be a buffer within a memory system component such as a memory controller, while the upstream component could be part of a cache controller, a coherent interconnect, or an input port for an interconnection network comprising the CDC. The apparatus described above may include a credit return path to transmit a credit return signal, allowing the system to ensure that data transmissions are only transmitted when there is sufficient space for the data in the downstream buffer.

The credit return signal may control the timing of a data transmission by incrementing or decrementing a credit pool in the upstream buffer. For example, if the upstream buffer is configured to increment a counter every time a transmission is sent to the downstream buffer, the upstream buffer may be configured to stop sending data transmissions downstream when the counter reaches some threshold value. A credit return signal may be transmitted upstream by the downstream buffer when a space becomes available in the buffer, and may trigger decrementing of the counter in the upstream buffer by one. Thus, the upstream buffer dynamically keeps track of the space expected to be available in the downstream buffer, so that the data transmission is only sent when there is sufficient space downstream.

In examples where the apparatus includes a credit return path, the primary signal discussed above may be the credit return signal. As such, the credit return signal can be protected from errors in the ways described above.

Alternatively, when the primary signal is a data transmission, the apparatus may still include a credit return path, and the credit return path may also be subjected to a lockstep error detection scheme as it crosses the clock domain boundary. In this case, a similar apparatus can be applied to the credit return path, but in the opposite direction (upstream instead of downstream). This allows both the data transmission and the credit return signal to be protected from errors using lockstep redundancy, even as both signals cross a clock domain boundary.

The credit return path described above may transmit the credit return signal from the second clock domain to the first clock domain. In other words, the second clock domain is the downstream clock domain and the first domain is the upstream clock domain, and the credit return signal is transmitted from the downstream clock domain to the upstream clock domain.

The credit return signal can also, in some examples, include a first credit return signal identifier, which may be one or more bits that uniquely identify the credit return signal. The apparatus (CDC) may also include a redundant credit return path for transmitting a redundant credit return signal, which includes a second credit return signal identifier. The redundant credit return signal is generated based on the original credit return signal and, in some examples, is generated by copying the credit return signal. A credit comparator in the first clock domain can then be provided to compare the first and second credit return signal identifiers in order to detect the presence of any errors in either the credit return signal or the redundant credit return signal. This provides an effective alternative technique for error detection in the credit return signal, which does not require the application of additional lockstep mechanisms to protect the credit return signal (in addition to the lockstep checking provided for the corresponding data transmission). Instead, use of an identifier associated with each credit return signals means a fixed delay between the credit return signal and redundant credit return signal is not needed as the relevant return signals to compare can be identified from their identifiers, so that there is no need for corresponding checking circuitry on the credit return path similar to that provided on the data transmission path to ensure certainty of the lockstep timing despite the crossing of the clock domain boundary.

The credit return signal identifier could be an entry identifier for a particular entry in the downstream buffer that has become available. This provides a simple technique for providing an identifier for the credit return signal.

The apparatus according to the present technique may include a number of clock domain bridges between the first and second clock domains, configured to transmit signals across the clock domain boundary. In particular, the apparatus may include a first clock domain bridge for transmitting the primary signal from the first clock domain to the second, and a redundant clock domain bridge for transmitting the first checking signal from the first clock domain to the second. Clock domain bridges provide a simple and readily available hardware component for transmitting signals across the boundary. The addition of the checking circuitry discussed above, in addition to such bridges, means that the fixed timing for lockstep can be recreated in the second clock domain.

The error checking procedure according to the present technique, applied by the error checking circuitry, may include comparing the first and second checking signals and returning an error indication when there is a difference between the two signals. This provides a quick and easy method for identifying errors in the checking signals using a simple bit-by-bit comparison.

A storage medium, such as a CD, DVD, flash memory drive, hard disk drive, or any other form of non-transitory storage medium may be provided, on which an electronic design file for an apparatus as discussed above can be stored. The electronic design file represents a design of such an apparatus, and can be used to generate a corresponding apparatus when the design file is supplied to manufacturing equipment for producing the physical form of the apparatus.

A computer-implemented method may be provided to generate a design file for an interconnection network for providing data transfer between a plurality of nodes of an integrated network, in response to determining that two or more of the nodes of the network operate in different clock domains to one another, where the clock domains have misaligned phases and/or frequencies. The designed interconnection network may include an apparatus as discussed above.

In some examples, a non-transitory recording medium may be provided, which stores a computer program for controlling a data processing apparatus to perform the computer-implemented method described above.

FIG. 1 schematically illustrates an example of a data processing system 2 (e.g. an integrated circuit or system-on-chip) having data access routing circuitry 4, 6 for routing data access requests between requesting nodes and destination nodes and routing the responses to such data access requests from the destination nodes to the requesting nodes. In this example the system 2 includes a number of master devices, such as: one or more central processing units (CPUs) 7 or clusters of CPUs; a graphics processing unit (GPU) 8; a USB master 10 for controlling interaction with devices over a universal serial bus (USB); a PCIe controller 12 for controlling interaction with devices connected to the system 2 over a PCI Express bus; a digital signal processor (DSP) 14; a display controller and/or image signal processor 16; a video controller 18; a system controller 20, which could provide a number of system control functions such as controlling direct memory access operations, controlling security operations such as encryption or other on chip security operations, or controlling interaction with peripherals; and a modem system controller 22 for controlling communications via a modem. All of the masters 7 to 22 may be capable of acting as a requesting node for issuing data access requests to be serviced by a destination node of the system.

The system may have a number of components which may act as destination nodes, for example including a number of memory controllers 26 for controlling access to dynamic random access memory (DRAM); a memory controller 28 for controlling access to static random access memory (SRAM); a memory controller 30 for controlling access to a read only memory (ROM); a flash memory controller 32 for controlling access to flash memory; a peripheral controller 34 for controlling access to peripheral devices; and a network interface controller 36 for controlling interaction with remote devices or further peripherals via a network interface. Also the destination nodes may include a system cache 38 within the data routing circuitry 4, 6, which can cache some data from the memory system 26-36 so that some data access requests can be serviced without needing to pass them on to a downstream memory component.

In the example of FIG. 1, some of the masters 7, 8 are coupled via a cache coherent interconnect 4 which is responsible for managing coherency between cached data held by the respective master's caches. The cache coherent interconnect may have a snoop filter 40 for tracking data cached in particular masters' caches and may respond to read and write data access requests specifying a target address by issuing snoop transactions to check for the coherency status of data associated with the target address cached in other masters, so that if one master requests read or write access to data, then data for the same address in another master's cache can be invalidated, or if dirty, the latest value in that other master's cache can be provided to the requesting master and/or written back to the memory system. Any known coherency protocol could be used for the cache coherent interconnect 4.

The other masters 10 to 22 (which may not comprise a cache) do not need to be connected via the cache coherent interconnect 4. A system interconnect 6 couples the outputs of the cache coherent interconnect 4 and the non-cached masters 10 to 22 with the respective destination devices 26 to 36. The system interconnect 6 is used for routing of transactions to a target destination node selected based on the target address specified by the request, and for routing of the responses back to the requesting node. In the arrangement shown in FIG. 1, the system interconnect 6 does not need to take responsibility for management of coherency between cache data in respective masters. However, in other examples, instead of providing a separate cache coherent interconnect 4 and system interconnect 6 as shown in FIG. 1, a single interconnect similar to the system interconnect 6 could be provided which connects each of the master and slave devices and also manages cache coherency.

In this example, the system interconnect 6 is implemented as a network on chip (NoC) which comprises a number of routers 44 for coupling a number of master interfaces 46 (from which data access requests, including read and write requests, can be received from respective master devices 7-22) to a number of destination interfaces 48 (for outputting the requests to respective destination devices 26-36). Each master interface 46 (also known as an ingress port, IP, or source endpoint) is responsible for decoding the address specified by the data access request to identify the particular route to be taken through the network on chip 6 via the routers 44 to reach a destination interface 48 associated with the selected destination node which is to service the data access request. In some cases the master interface 46 may also translate the protocol used for the request asserted to the network on chip 6 into an internal representation to be used for routing the request across the network on chip 6. If the requests are translated into an internal protocol, then the destination interfaces 48 (also known as egress ports, EP, or destination endpoints) may translate them back into the original protocol used by the request in order for servicing by the destination. Alternatively, some of the destination nodes may handle the request directly in the form used by the network on chip 6 so that no translation would be needed at the destination interface. For each destination interface 48, when it receives the response to a data access request from the destination node 26-36, the destination interface 48 issues that response back along the path taken by the corresponding request to the master interface 46 which issued the request, and the master interface 46 then returns the response to the requesting node.

A network on chip 6 as shown in FIG. 1 can be useful when there are a large number of master and destination devices to be connected, as the arrangement of routers 44 can be designed bespoke for the requirements of a given system in order to provide for an appropriate level of bandwidth and to provide sufficient number of routers that the physical distance over which requests have to be routed on the chip can be accommodated without significant increase in signal delay. For pairs of requesting and destination nodes which are expected to require a large amount of traffic then additional routers or signal channels can be provided between them, while other pairs of requesting/destination nodes may have less capacity.

In some examples, the network on chip may have a mesh topology, where each interface 46, 48 is connected to a point on a grid and requests and responses may traverse between the points on the grid associated with the corresponding master and destination interfaces 46, 48. Other NoC topologies are also possible.

However, the use of a network on chip is not essential and in other examples a different topology could be used within the system interconnect 6. For example, a series of point to point connections between the master and destination interfaces could be used, or a ring topology may be used in which all requests are asserted onto a ring bus and then circulate round until they reach the required target interface. However, use of a network on chip can enable better scaling as the number of master and destinations increases.

Although FIG. 1 shows an example of a network for routing signals between master and slave devices within an integrated circuit, in other examples the devices connected by the interconnect may not have a master-slave relationship, but instead the devices could be connected by peer-to-peer connections. Also, in some examples some requests routed by the network may target a destination node within the interconnect itself, such as points of coherency or caches, rather than targeting a destination node outside the interconnect.

Figure 2:
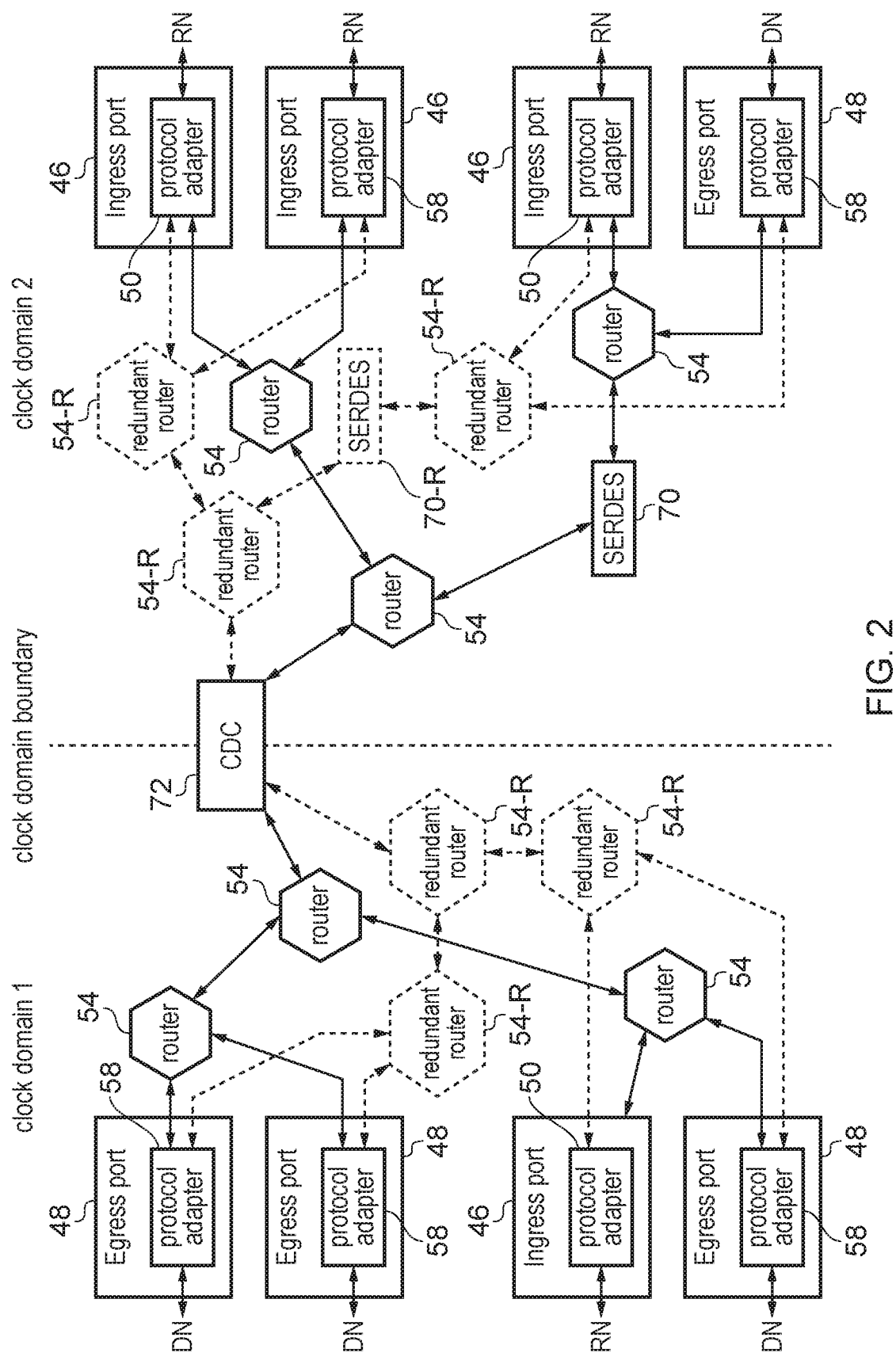
FIG. 2 shows an example of a network on chip acting as the system interconnect in the example of FIG. 1.

FIG. 2 shows an example of components on the network on chip (NoC) 6 in more detail. The NoC 6 comprises a number of components which can be combined in different layouts and arrangements depending on the particular arrangement of master devices and destination devices which are to be connected by the NoC 6. For example this may include any of the following components:

Ingress Port (Source Endpoint) 46

The ingress port receives data access requests from a requesting node coupled to the ingress port. For example the ingress port may act as one of the master interfaces 46 shown in FIG. 1. The ingress port 46 may decode a target address as specified by the data access request received from the requesting node to identify which egress port 48 should be selected for handling the request, and generates routing information for controlling the routing of the request across the NoC to the selected egress port 48. Also, as requests routed within the NoC 6 may use a different protocol to the protocol used by the requesting nodes for the data access requests, the ingress port may include a protocol adapter 50 for translating the request into the transport protocol used on the network. The ingress port 46 transmits the translated packets onto the network accompanied by routing information identifying how network packets corresponding to the request should be routed across the NoC. The ingress port 46 may also provide other functions such as managing resource allocation for particular requests, and controlling a quality of service level provided for requests from different sources so as to balance the competing needs of different master devices for bandwidth on the network. For example the ingress port 46 may have various buffers for buffering tracking information relating to requests and buffering responses to the requests. The ingress port 46 may control allocation of resource and issuing of requests based on availability of space in the buffers, and based on the quality of service requirements (e.g. providing a limit to the number of currently outstanding transactions that can be pending at a given time, or a limit to the number of transactions from a given requesting mode which are serviced within a given period).

Router 54

Each router 54 is responsible for routing packets received from one component of the NoC 6 and selecting which other component the packet should be directed to, based on the routing information specified by the packets which has been appended to the packet by the ingress port 46 at which the corresponding request originated. The particular arrangement and number of routers 54 that are provided may depend on the particular system requirements. For example, if ingress and egress ports are separated by a large distance on the integrated circuit then more routers may be required to provide sufficient repetition of packets to maintain signal level when the packets reach their destination. Also the topology in which the routers are connected may be selected based on expected bandwidth requirements for particular pairs of ports 46, 48.

Egress Port (Destination Endpoint) 48

The egress port 48 receives the network packets representing data access requests that were generated by the ingress port 46 and routed across the NoC via the routers 54. The egress port 48 has a protocol adapter 58 for translating the transport protocol of the network packets back into the protocol used by the destination node to which the egress report is connected. Some forms of request may not require a response from the destination node. However, for requests which do require a response (e.g. a read response, a write response or both), when a response to a data access request is received from the destination node which has serviced the data access request, the responses can be adapted for the transport protocol of the network by the protocol adapter 58 in the egress port 48 and then output onto the network by the egress port 48. In some cases, the response packets may be routed back to the ingress port 46 which received the original data access request which triggered those responses, e.g. along a corresponding path to the one taken by the data access request packets but in the reverse direction, or on a different path. In other cases, the response packets may be routed to a different ingress port as they may sometimes need to be provided to a different requesting node to the requesting node that issued the original request (e.g. due to a change in coherency state in the caches of the respective masters). Hence again the protocol adapter 58 may append routing information specifying the route to be taken by the response packets. When these response packets are received at the ingress port 46, the protocol adapter 50 converts them into the responses expected by the requesting nodes and forwards them onto the requesting node.

Note that in some examples the functions of the ingress/egress ports may also be handled at a network bridge component (at the boundary between two network portions), so that the network bridge may effectively act as both an ingress port and an egress port for at least some purposes.

Data Resizer 70

It may be needed to resize data values being transmitted across the network when being provided from one component to another. For example a packet comprising a smaller number of flits could be spilt into a packet comprising a greater number of flits of a smaller data size, or a packet comprising smaller flits could have flits combined or repartitioned into a smaller number of flits of greater size. If the resizing is such that the number of input flits and the number of output flits follows a many-to-one or one-to-many relationship then the resizer 70 may act as a serialiser-deserialiser (SERDES) as shown in FIG. 2. However, it is also possible for resizers to provide an M:N resizing of data flits where both N and M are greater than 1, and in this case a more general resizer may be provided to map the data associated with a certain group of input flits to the data associated with a different number of output flits. In some embodiments, it may also be possible to convert a certain number of received packets to a different number of packets to be transmitted on the remaining part of the network.

Clock Domain Crossing (CDC) 72

As shown in FIG. 2, the NoC 6 may span multiple clock domains with components in one clock domain operating according to a clock signal which is different in one or both of the frequency and phase to the clock controlling the components in another clock domain. For example, the respective clock signals in the different clock domains could be asynchronous signals which have different clock frequencies, or could be mesochronous clock signals which have the same frequency but are offset in phase. At a clock domain boundary, the misaligned clocks mean that simply connecting the signal in the upstream domain to the corresponding signal path in the downstream domain could risk the downstream domain sampling the signal at the wrong timing relative to the clock of the source domain. The CDC 72 will be described in more detail below.

Redundant Network Components

As shown in FIG. 2, in addition to the components 54, 70, 72 defining the primary network for routing of primary payloads across the NoC, the NoC also comprises a redundant network which partially duplicates at least some of the primary network components of the primary network. For example, in FIG. 2 the network includes a number of redundant routers 54-R which mirror the corresponding main routers 54 of the primary network. Also the data resizer 70 of the main network may have a corresponding redundant network data resizer 70-R. The clock domain crossing 72 may have both main and redundant channels within it to allow the main and redundant signals to bridge across the clock domain boundary, but may also include cross-checking circuitry to check the redundantly transmitted payload against the primary payload at the CDC 72. The ingress ports 46 and egress ports 48 are also not duplicated as the ingress port 46 is responsible for taking the request received from receiving node and mapping it to the corresponding primary and redundant payloads, and the egress port 48 extracts the information from the primary and redundant payloads and maps this information to an ongoing information to be transmitted to the destination node. By providing a redundant network which provides redundant information which at least partially replicates information travelling on the primary network, this can be used for error checking at the egress ports 48 to determine whether a permanent or transient fault has occurred during routing of the primary payload or the redundant payload which may potentially cause incorrect operation.

It will be appreciated that the network-on-chip 6 could also include other components not shown in FIG. 2.

One approach for implementing redundancy for functional safety purposes could be for the redundant network to duplicate some or all of the components of the primary network and route such that a redundant signal, substantially identical to the primary signal (e.g. identical aside from any errors that might be present in either the primary signal or the redundant signal) is transmitted in parallel to the primary signal. The redundant signal can later be used in an error checking procedure further downstream to identify any errors present in either the primary signal or the redundant signal. In this case, the error checking procedure will typically involve comparing the primary signal and the redundant signal in order to identify any differences between the two, which signify an error in one of the two signals. However, this may be expensive in terms of additional processing logic and circuit area as each redundant router 54-R and other redundant components 70-R may have to be expanded, and as there are many such components in a typical NoC, this may cause a great increase in circuit area. An alternative, less expensive approach is to transmit, in parallel to the primary signal, some other checking signal derived from the primary signal, such that the checking signal has fewer bits than a portion of the primary signal from which it was derived. This could be an error checking code such as a hash function (including cyclic redundancy check codes or cryptographic hash functions), a checksum, an ECC, DED or SECDED code, or any other form of error checking code. In this case, a different error checking procedure can be applied using the checking code and the primary signal, depending on the type of error detection scheme used.

In either case, the primary signal and the redundant signal (or other checking signal) can be separated in time by a predetermined time delay (e.g. the checking signal is delayed with respect to the primary signal) such as to provide additional protection by further reducing the likelihood that a fault or event at a particular time will affect both the primary signal and the checking signal in the same way. Alternatively, the delay can be zero.

However, relying on a fixed time delay between the primary and redundant signals can increase complexity when crossing a clock domain boundary from a first clock domain with a particular clock phase and frequency to a second clock domain with a different clock phase or a different clock frequency. Due to the mismatch in the phases or frequencies of the clock signals in the two clock domains, the delay between the primary signal and the checking signal may be distorted as the signals cross the domain boundaries at different times. This can cause the error detection scheme to be ineffective, and may compromise the functional safety of the system.

Figure 3:
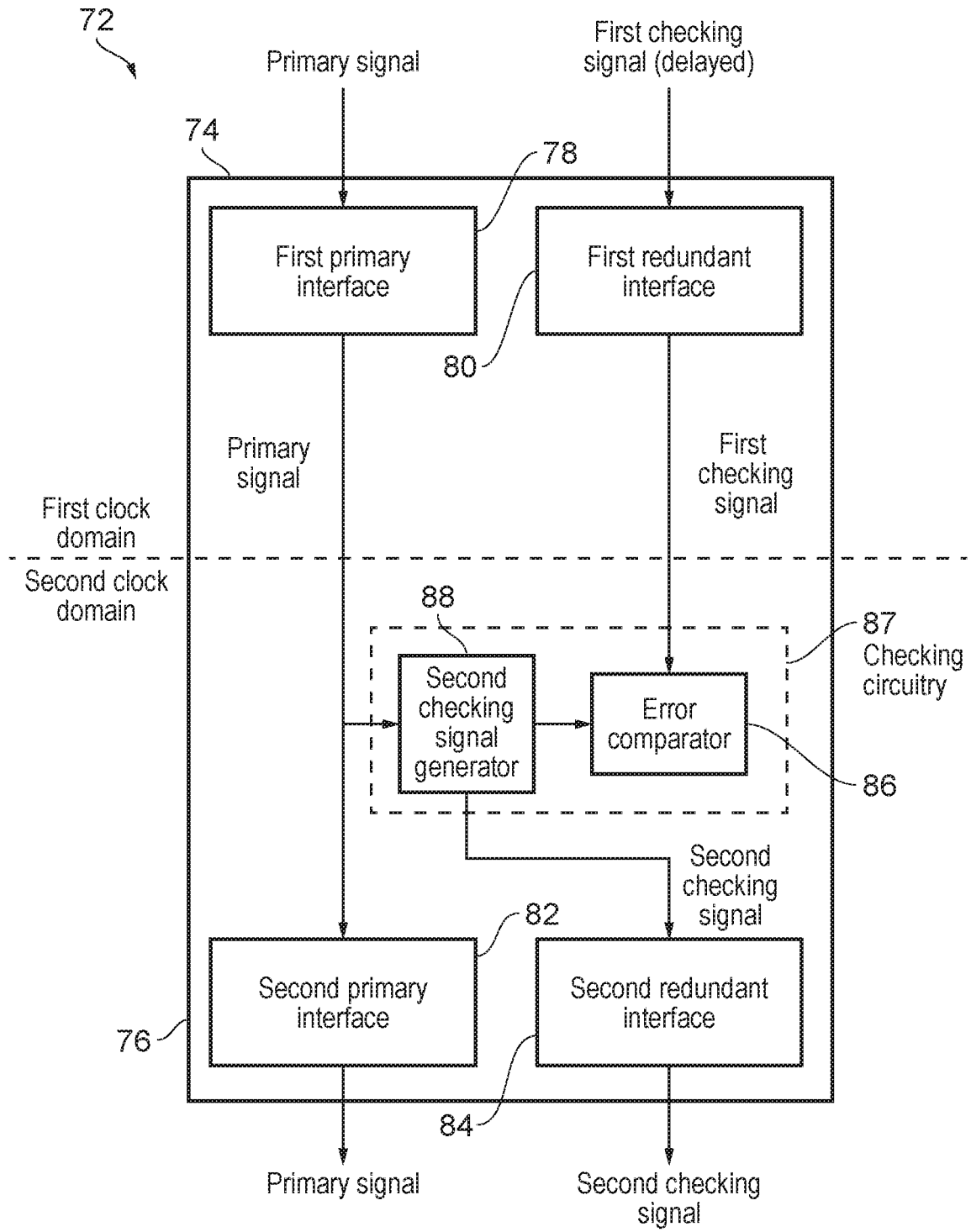
FIG. 3 shows an example of a clock domain crossing.

FIG. 3 is an example configuration of a CDC 72 according to an example of the present technique, which overcomes the above-described problems with using lockstep redundancy systems across clock boundaries. CDC 72 includes a first portion 74 on the side of the first clock domain and a second portion 76 on the side of the second clock domain. The first portion 74 includes a first primary interface 78 for receiving the primary signal and a first redundant interface 80 for receiving the first checking signal. The first portion 74 receives the primary and first checking signals from upstream components of the network, such as a network router 54 or ingress port 46. As discussed above, the first checking signal is delayed, so that it is received at the first portion 74 a predetermined time after the primary signal is received at the first portion 74. The first checking signal is based on the primary signal, in some cases being generated by copying the primary signal. In other cases, the first checking signal could be an error checking code of a different form, with fewer bits than a portion of the primary signal from which it is derived. The first checking signal could be transmitted over the redundant network while the primary signal is transmitted over the primary network. The first portion 74, including the first primary interface 78 and the first redundant interface 80 are all in the first clock domain.

The second portion 76 includes a second primary interface 82 for outputting the primary signal and a second redundant interface 84 for outputting a second checking signal. The second checking signal is generated in the second clock domain based on the primary signal, following a similar process as that used to create the first checking signal in the network component that generated the first checking signal (e.g. in the ingress port 46 from which the message originated). If the first checking signal is generated by copying the primary signal, the second checking signal is also generated by copying the primary signal. Alternatively, if the first checking signal is generated by applying some function to a portion of the primary signal to create an error checking code with fewer bits than the number of bits in the respective portion, the second checking signal is also generated by applying the same function to the primary signal.

Also in the CDC 72, in the second portion 76, is checking circuitry 87 comprising an error comparator 86 and second checking signal generation circuitry 88. The error comparator 86 receives the first checking signal from the first redundant interface 80, and the second checking signal from the second checking signal generation circuitry 88, and performs an error checking procedure. The second checking signal generation circuitry 88 can generate the second checking signal in any of a number of ways. For example, the second checking signal generation circuitry 88 may be time delay circuitry, configured to provide the delayed primary signal to the error comparator 86 as the second checking signal after a time delay equal to the predetermined time delay between the primary signal and the first checking signal. Alternatively, the second checking signal generation circuitry 88 may be configured to generate an error checking code of a different form, such as an error checking code generated using any error detection scheme including, for example, hash functions such as cyclic redundancy checks or cryptographic hash functions, checksums, or any other form of error checking procedure. In either case, the second checking signal generation circuitry 88 is configured to provide the second checking signal to the error comparator 86 after the predetermined time delay.

The error comparator 86 performs an error checking procedure based on the first and second checking signals to determine whether there are any errors present in either of the first and second checking signals. The error checking procedure varies depending on the form of the checking signals and on the error protection scheme in place, but could, for example, involve comparing the first and second checking codes and identifying any differences between them as potential errors.

The second portion 76, including the second primary interface 82 and the second redundant interface 84, the second checking signal generation circuitry 88 and the error comparator 86, is in the second clock domain. The second checking signal is therefore generated in the second clock domain after the primary signal has crossed the clock domain boundary, so the difference in the phase or frequency of the clocks in the first and second clock domains does not affect the time delay between the primary signal and the second checking signal. The lockstep redundancy is thus essentially recreated in the second domain from a later version of the primary signal (e.g. after it has passed the clock domain boundary), overcoming the above-described issues with implementing lockstep redundancy across multiple clock domains. In addition, by providing error comparator 86 in the second clock domain to perform an error checking procedure using the first and second checking signals, any errors already present in the primary signal that are propagated in the second checking signal are identified.

Figure 4:
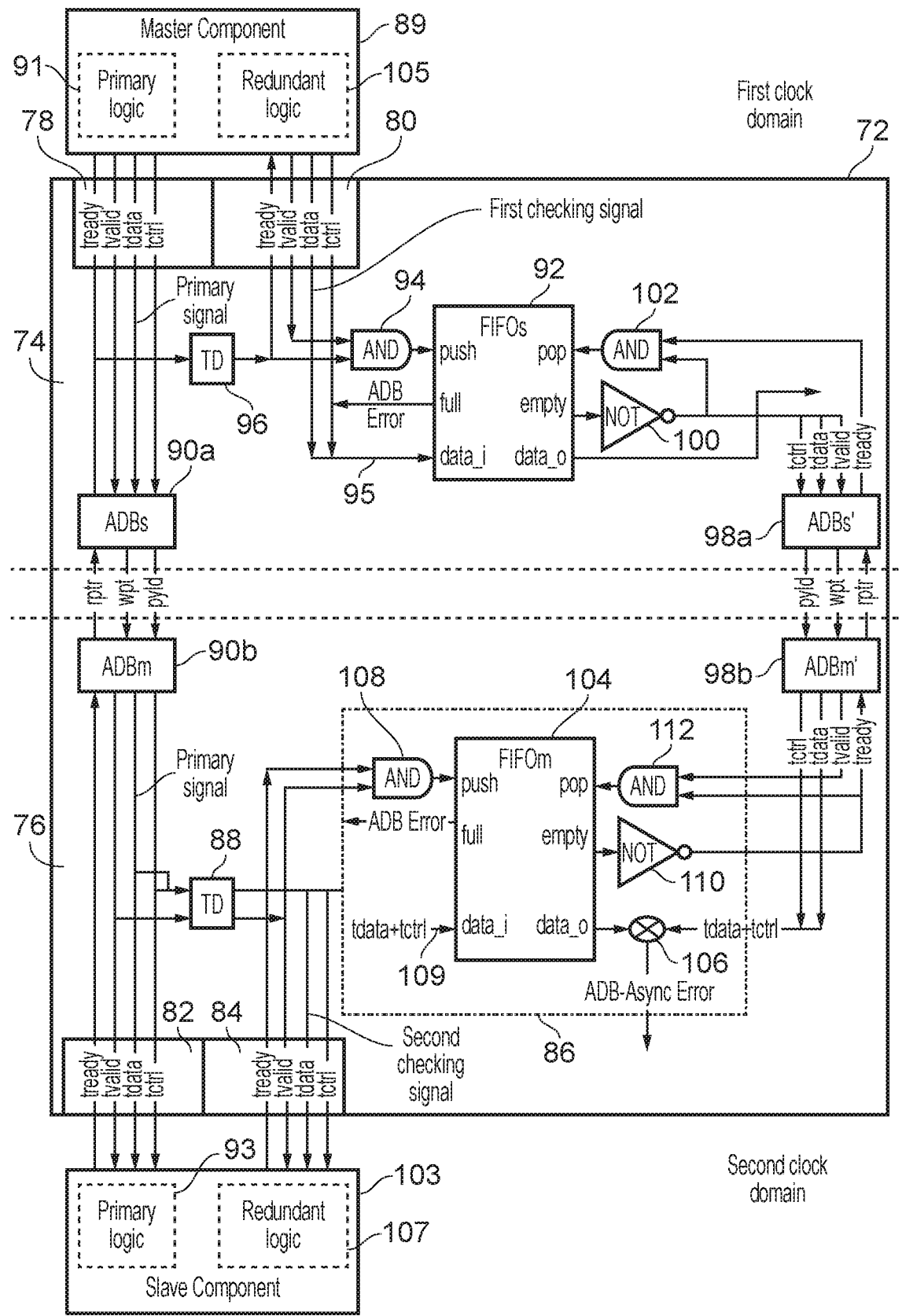
FIG. 4 shows a further example of a clock domain crossing.

FIG. 4 shows an example of a system for transmitting signals between a master component 89 and a slave component 103 in different clock domains, including the CDC 72. The CDC 72 shown in FIG. 4 includes a first portion 74 in the first clock domain and a second portion 76 in the second clock domain. The first portion 74 includes a first primary interface 78, which is arranged to receive a primary signal from a master component 89 and transmit the primary signal to the second primary interface 82 in the second portion 76 via an asynchronous domain bridge (ADB) 90 crossing the clock domain boundary. In the example shown in FIG. 4, signals are transmitted according to a handshake protocol. In the case of the transmission of the primary signal from the first primary interface 78 to the second primary interface 82, the handshake protocol is as follows:

1. Primary logic 91 in the master component 89 sends a "valid" signal (tvalid) to primary logic 93 in a slave component 103, indicating that the master component 89 is ready to transmit the primary signal;
2. The primary logic 93 in the slave component 103 sends a "ready" signal (tready) to the primary logic 91 in the master component 89, indicating that the slave component 103 is ready to receive the primary signal;
3. The primary logic 91 in the master component 89 sends the primary signal to the slave component 103 (tdata).

It will be appreciated that such a valid-ready handshake is not essential and other mechanisms could be used to control the timing at which data is transmitted.

In some examples, the slave component 103 may send a response signal (not shown) to the master component 89, indicating that it has successfully received the primary signal. The master component 89 also sends control data to the slave component 103, in the form of a control signal (tctrl). The control data may be routing control data used to control routing of the network packets over the network (e.g. controlling selection of routers or packet formatting), so in some cases the tdata and tctrl signals together can be regarded as the primary signal on the primary channel. The valid, ready, control and primary signals are all transmitted between the master and slave components 89, 103 via the first and second primary interfaces 78, 82.

The primary signal, as well as the valid, ready and control signals, are transmitted to between the first and second clock domains via an asynchronous domain bridge (ADB) 90. The ADB 90 exists across both clock boundaries, with a "master" side 90b in the second clock domain and a "slave" side 90a in the first clock domain. The ADB 90 is configured to transmit signals across a boundary between clock domains with different clock phases, clock frequencies or power/voltage requirements.

The first redundant interface 80 is arranged to receive the first checking signal from the master component 89 a predetermined time after the primary signal is received by the first primary interface 78, and transmit it to a delay buffer 92 provided in the first portion 74 of the CDC 72. The first checking signal is transmitted to the delay buffer 92 using a similar handshake protocol to the one described above, in which:

1. Redundant logic 105 in the master component 89 sends a valid signal (tvalid) to the delay buffer 92 via an AND gate 94.
2. A copy of the ready signal sent from the primary logic 93 in the slave component 103 to the master component 89 via the first redundant interface 80 is transmitted via time delay circuitry 96 to both the AND gate 94 and the redundant logic 105 in the master component 89. The time delay circuitry 88 inserts a time delay equal to the predetermined time between the arrival of the primary signal and the first checking signal at the first portion 74, ensuring that the ready signal is not received by the first redundant interface 80 until it has received the first checking signal.
3. When the redundant logic 105 in the master component 89 receives the ready signal, it sends the first checking signal to the delay buffer 92 via the first redundant interface 80.
4. When it receives both the valid and ready signals, the AND gate 94 generates a "push" signal, which triggers the delay buffer 92 to sample the first checking signal value provided at its data input 95 and allocate it to an available entry.

The redundant logic 105 in the master component 89 also sends control data in the form of a control signal (tctrl) to the delay buffer 92 (which may also be considered to be part of the first checking signal), and the delay buffer 92 is arranged to generate a "full" signal (ADB error) if it is full (e.g. if there are no available entries in the delay buffer 92).

The delay buffer 92 is, in this example, a first-in-first-out (FIFO) buffer, in particular a transparent FIFO, and is arranged to store the first checking signal until it receives an indication from an error comparator 86 (provided in the second portion 76 of the CDC 72) that the second checking signal is ready for comparison with the first checking signal. The number of entries in the delay buffer 92 should be sufficient to prevent it from being filled with checking signals yet to be transmitted to the second clock domain—for example, in most cases, two entries is sufficient. The delay buffer 92 is arranged to transmit the first checking signal to the error comparator 86 via an ADB 98 using a handshake protocol. In particular, the delay buffer 92 generates an "empty" signal when it is empty, which passes through a NOT gate 100, generating a valid signal (tvalid) when the buffer is not empty, which is transmitted to the error comparator 86 and to an AND gate 102. The error comparator 86 is, in response, configured to transmit a ready signal (tready) to the AND gate 102. Once the AND gate 102 receives both the valid and ready signals, a "pop" signal is generated, which triggers the delay buffer 92 to transmit the first checking signal to the error comparator 86. The delay buffer 92 also sends a control signal (tctrl) to the error comparator 86.

The valid, ready and control signals and the first checking signal are all transmitted from the delay buffer 92 to the error comparator 86 via an ADB 98. ADB 98 crosses the domain boundary and operates in the same way as the other ADB 90. While the bridges 90, 98 may provide buffering to provide safe transmission of the signals across the clock domain boundary, they may not be able to provide a guaranteed time delay between the primary and redundant signals.

The first portion 74, including the first primary interface 78, the first redundant interface 80, the delay buffer 92, the time delay circuitry 96, the AND gates 94, 102 and the NOT gate 100, is in the first clock domain.

The second portion 76 provided in the second clock domain includes, in addition to the second primary interface 82, a second redundant interface 84, configured to receive the second checking signal from the second checking signal generation circuitry 88 and output it to a slave component 103 following a time delay after the primary signal is output, the time delay being equal to the above-described predetermined time delay. In this example, the second checking signal generation circuitry 88 is time delay circuitry, configured to generate the second checking signal by receiving the primary signal and delaying it by the predetermined time before transmitting it to the error comparator 86 and the second redundant interface 84 (i.e. the time delay circuitry simply copies the primary signal and delays it).

In the example of FIG. 4, the error comparator 86 includes a compare buffer 104 and compare circuitry 106. The compare buffer 104—in this case a compare FIFO—is configured to store the second checking signal until the delay buffer 92 indicates (with the valid signal described above) that the first checking signal is available for comparison with the second checking signal by the comparison circuitry 106.

The second checking signal is transmitted to the compare buffer 104 and to the second redundant interface 84 by the second checking signal generation circuitry 88 using a handshake protocol as follows:

1. The second checking signal generation circuitry 88 generates a valid signal (tvalid) (based on the tvalid signal on the primary channel) and sends it, via the second redundant interface 84, to redundant logic 107 in the slave component 103, and to an AND gate 108 in the error comparator 86.
2. The redundant logic 107 sends a ready signal (tready) to the AND gate 108.
3. The second checking signal generation circuitry 88 sends the second checking signal along with a control signal (tdata+tctrl) to the second redundant interface 84 and the compare buffer 104, and the second redundant interface 84 outputs the second checking signal to the redundant logic 107.
4. Once both the valid and ready signals are received by the AND gate 108, it generates a push signal in the compare buffer 104, indicating that the second checking signal should be sampled at the data input 109 of the compare buffer 104 and allocated to the next entry of the compare buffer 104.

The compare buffer 104 is configured to generate an empty signal when all entries in the buffer are available. The empty signal is transmitted to a NOT gate 110, which generates the ready signal (tready) when the compare buffer 104 contains the second checking signal. This ready signal is transmitted to the AND gate 102 coupled to the delay buffer 92 as described above. The ready signal is also sent to a further AND gate 112, which also receives the tvalid signal generated by the NOT gate 100 coupled to the delay buffer 92. Once the AND gate 112 receives both the valid and ready signals, it generates a pop signal in the compare buffer 104, which indicates that the first and second checking signals are both ready to be compared, and triggers the compare buffer 104 to output the second checking signal from the oldest valid entry of the compare buffer 104 to the compare circuitry 106. The compare buffer 104 is also arranged to generate an error signal (ADB error) when the compare buffer 104 is full (e.g. no entries in the compare buffer 104 are available).

The compare buffer 104 is, in this example, a first-in-first-out (FIFO) buffer. The number of entries in the compare buffer 104 should be sufficient to prevent it being filled with checking signals yet to be transmitted to the compare circuitry 106—for example, in most cases, two entries is sufficient.

The compare circuitry 106 is configured to perform an error checking procedure based on the first and second checking signals, to determine if there are any errors present in either of the checking signals. The error checking procedure performed by the compare circuitry 106 in this example is a comparison between the first and second checking signals. The compare circuitry 106 is configured to trigger an error handling response when there is a mismatch between the two checking signals. For example the signal ADB-Async Error may be generated when a mismatch is detected could trigger a fault handling response, e.g. requesting retransmission of the primary/redundant signals, or signalling an interrupt or exception or other fault condition which may trigger software to take action.

The second portion 76, including the second primary interface 82, the second redundant interface 84, the time delay circuitry 88, and the error comparator 86, is in the second clock domain.

Figure 5:
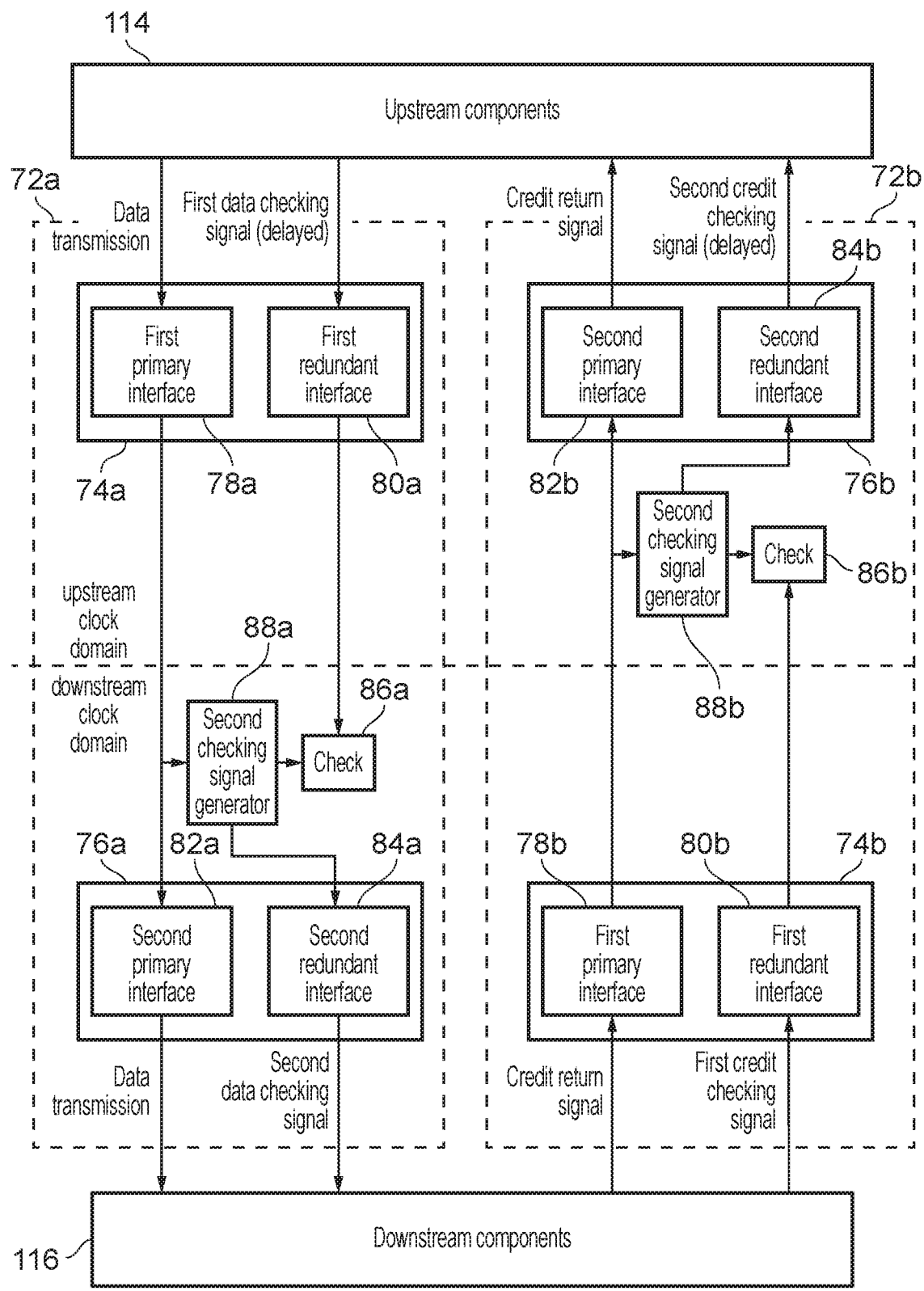
FIG. 5 shows an example of a system for transmitting a signal across a clock domain boundary.

FIG. 5 shows an example of a system in which a primary signal is transmitted between upstream components 114 (which may include the master component 89 shown in FIG. 4) and downstream components 116 (which may include the slave component 103 shown in FIG. 4), where the upstream components 114 and downstream components 116 are in different clock domains. The primary signal is transmitted between the upstream components 114 and the downstream components 116 via a CDC 72a according to FIG. 3.

FIG. 5 also shows a credit return path for transmitting a credit return signal between the downstream components 116 and the upstream components 114 which, in this case, is in the form of a further CDC 72b.

The credit return signal is a signal indicating to the upstream components 114 the availability of space in the downstream components 116, allowing the upstream components 114 to delay transmission of the primary signal if there is insufficient space available in the downstream components 116. The credit return signal may be protected using similar lockstep redundancy measures to those used to protect the primary signal, and so it is advantageous to provide a further CDC 72b according to the present technique for the transmission of the credit return signal across the domain boundary from the downstream clock domain to the upstream clock domain. The CDC 72b making up the credit return path is identical to the CDC 72a for transmitting the primary signal across the clock domain boundary, except that it is reversed—e.g. the first clock domain for the CDC 72b protecting the credit return signal is in this case the downstream clock domain, and the second clock domain is the upstream clock domain.

The credit return signal can indicate the availability of space in the downstream components 116 in a variety of ways. In one example, an upstream buffer in the upstream components 114 includes a credit counter which increments a value every time a primary signal is transmitted from the buffer. When the value reaches a predetermined maximum value (e.g. a value corresponding to the maximum number of available slots in a downstream buffer in the downstream components 116), the upstream buffer ceases to transmit primary signals until the counter returns to a value below the predetermined maximum. When the upstream buffer receives a credit return signal, the counter is decremented, indicating that one more slot has become available in the downstream buffer. In this way, the upstream buffer dynamically tracks the availability of space in the downstream buffer. Alternatively, in another example, the upstream buffer includes a credit pool instead of a credit counter, in which a value is decremented every time a primary signal is transmitted. In this case, the upstream buffer ceases to transmit primary signals when the value reaches a predetermined minimum (e.g. a value indicating that no slots are available in the downstream buffer; for example the predetermined minimum could be zero) and the credit return signal triggers the credit pool to increment the value.

Figure 6:
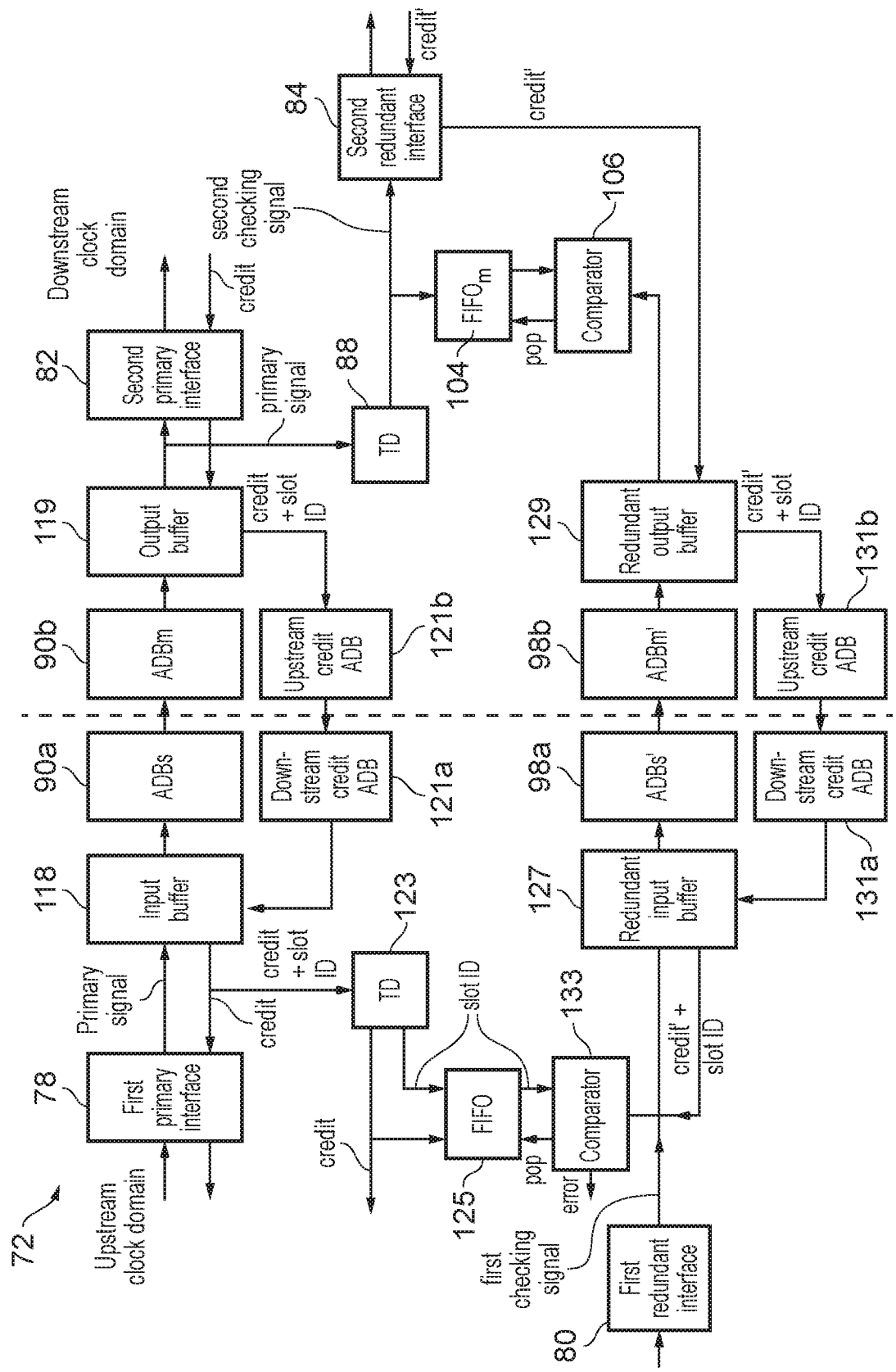
FIG. 6 shows a further example of a system for transmitting a signal across a clock domain boundary.

FIG. 6 shows a further example of a CDC 72. In FIG. 6, a primary signal is received at a first primary interface 78 and a first checking signal is received at a first redundant interface 80. The primary signal is transmitted to an input buffer 118, which transmits the signal to an output buffer 119 via an ADB 90. The output buffer transmits the primary signal to the second primary interface 82, which outputs the signal to various downstream components 116 (not shown). A copy of the primary signal is also transmitted from the output buffer 119 to the second checking signal generation circuitry 88 (in this case time delay circuitry), which generates the second checking signal and outputs this to the second redundant interface 84 and the compare buffer 104.

As in FIG. 5, the downstream components 116 may transmit a credit return signal on receipt of the primary signal. The credit return signal (credit) is received at the second primary interface 82 and transmitted to the output buffer 119. The output buffer transmits the credit return signal along with a unique identifier (slot ID) to the input buffer 118 via a credit ADB 121. The unique identifier is, in this example, a slot ID identifying a slot in a downstream buffer which has become available, however the unique identifier could be any unique signal identifying the credit return signal. The credit return signal is then transmitted to the first primary interface 78, and a copy of the credit return signal along with the unique identifier is sent to time delay circuitry 123. The credit return signal and unique identifier are transmitted to a FIFO 125.

It should be noted that while in many situations it is useful for the identifier to be truly unique, in some situations it is adequate for the identifier to uniquely identify the credit return signal to an acceptable level of probability, which may be dependent on a balance of the safety and efficiency requirements of the system.

The first redundant interface 80 receives a first checking signal, which it transmits to a redundant input buffer 127. The redundant input buffer 127 transmits the first checking signal to a redundant output buffer 129 via an ADB 98. The first checking signal is then transmitted to the compare circuitry 106 which triggers compare buffer 104 to transmit the second checking signal to the compare circuitry 106. The compare circuitry 106 compares the first and second checking signals to check for errors.

The downstream components 116 may transmit a redundant credit return signal (credit') to be compared with the original credit return signal in the upstream clock domain. The redundant credit return signal is received by the second redundant interface 84 and transmitted to the redundant output buffer 129. The redundant output buffer 129 transmits the redundant credit return signal along with a redundant identifier (a slot ID in this example) to the redundant input buffer 127 via a redundant credit ADB 131. The redundant input buffer 127 transmits the redundant credit return signal and the redundant identifier to a comparator 133, which triggers the FIFO 125 to output the unique identifier to the comparator 133. The comparator 133 compares the unique identifier and the redundant identifier, and, if it determines that there is a mismatch between them, it outputs an error signal (error) indicating that there may be an error in the credit return signal or the redundant credit return signal, With this approach, if an error occurs which results in either the primary or redundant credit return signal being delayed, the comparator 133 can detect the error because the non-delayed one of the primary and redundant credit return signal may be compared with another credit return signal relating to a different instance of transmission of the primary signal, which can be detected from the mismatching identifiers of the primary and redundant credit return signals.

Figure 7:
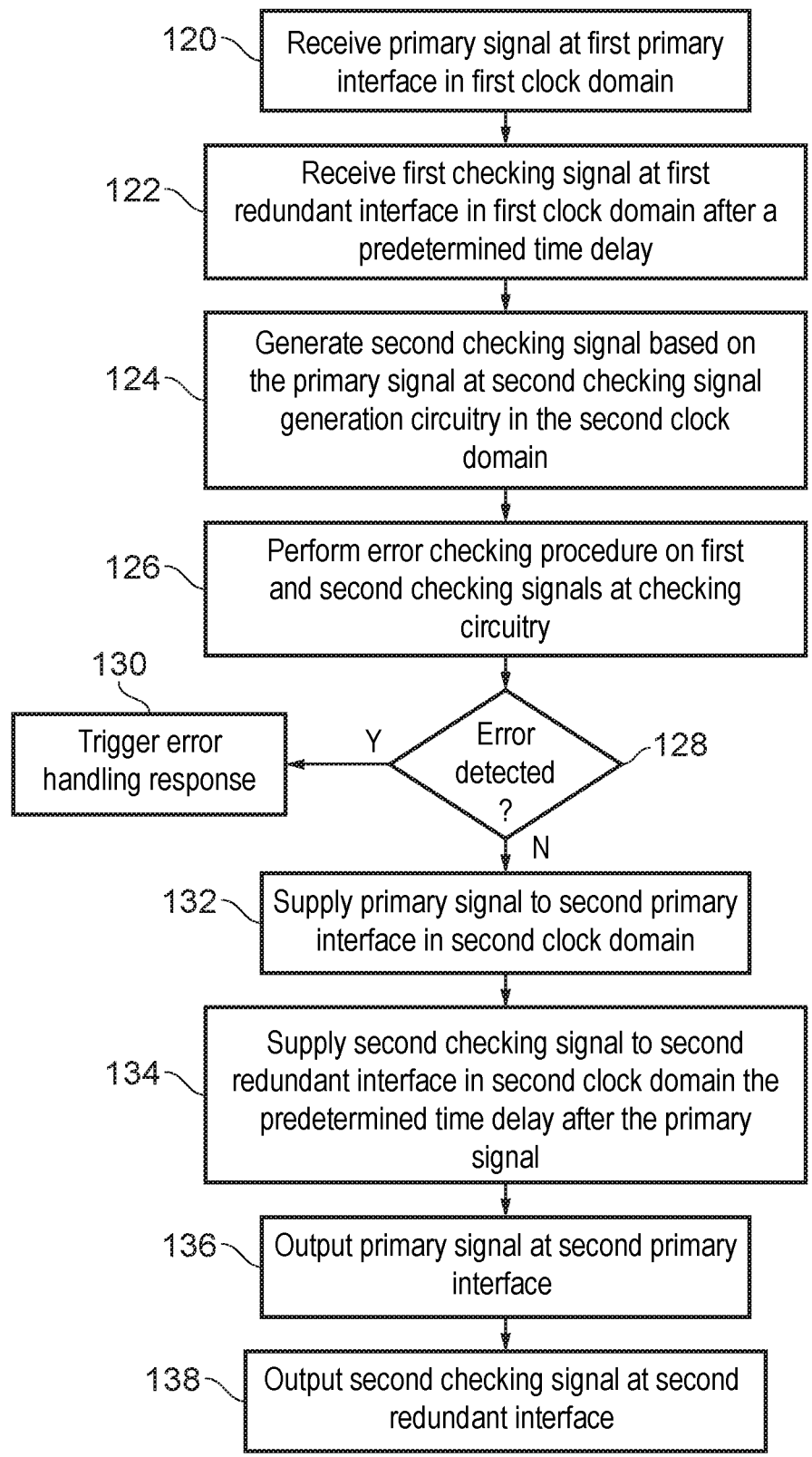
FIG. 7 is a flow diagram showing a method of transmitting a signal between clock domains with different clock frequencies or phases.

FIG. 7 is a flow diagram showing a method of transmitting a primary signal across a clock domain boundary according to the present technique. In step 120, a primary signal is received at a first primary interface 78 in the first clock domain, and in step 122, a first checking signal is received at a first redundant interface 80 in the first clock domain after a predetermined time delay.

In the second clock domain, in step 124, a second checking signal is generated based on the primary signal. The second checking signal is generated by second checking signal generation circuitry 88, which may be time delay circuitry configured to supply a copy of the primary signal after a delay equal to the predetermined time delay described above. Alternatively, the second checking signal generation circuitry 88 may be configured to generate the second checking signal using some other error detection procedure, in which the second checking signal is an error check code based on a portion of the primary signal, and contains fewer bits that the number of bits in the portion of the primary signal. The first and second checking signals are of the same form, generated according to corresponding processes.

Whatever the form of the first and second checking signals, in step 126 an error checking procedure is carried out based on the two checking signals. The error checking procedure is performed by error comparator 86 and, in some examples, involves comparing the first and second checking signals. Other error checking procedures may also be used, however. In step 128, it is determined whether or not an error is present in one of the checking signals. If an error is determined to be present, an error handling response is triggered 130. The error handling response 130 may involve preventing any of steps 132 to 138 being carried out. The error handling response could also include signalling to the upstream component which generated the primary signal that an error occurred, which could respond by retransmitting the data or taking some other action. Other error handling responses can also be used.

If an error is not detected, the method proceeds to step 132. In step 132, the primary signal is supplied to a second primary interface 82 in the second clock domain. In step 134, the second checking signal is supplied to a second redundant interface 84 in the second clock domain after the predetermined time delay. In step 136, the primary signal is output at the second primary interface 82, and in step 138, the second checking signal is output at the second redundant interface 138.

Figure 8:
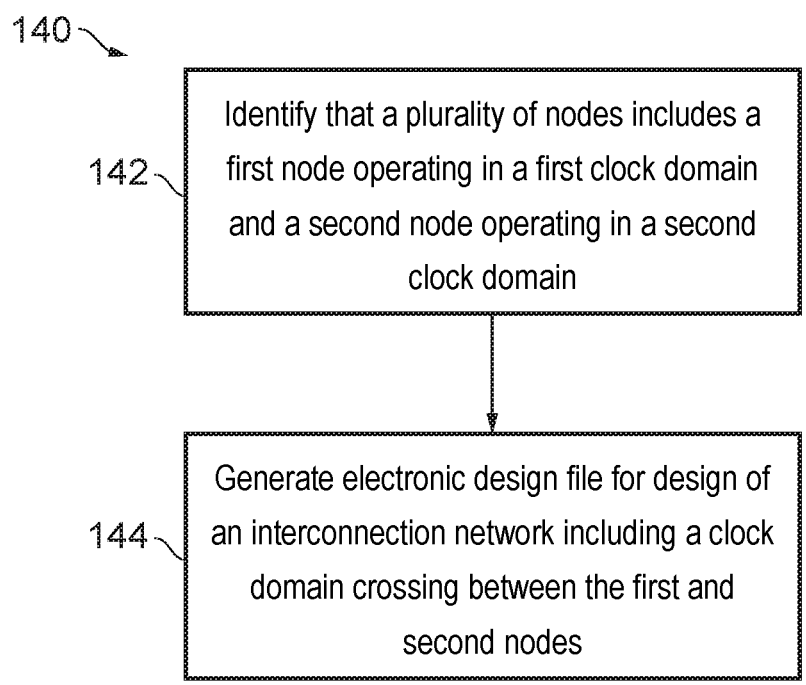
FIG. 8 is a flow diagram showing a method of generating an electronic design file representing a design of an interconnect.

FIG. 8 is a flow diagram showing a computer-implemented method 140 of generating an electronic design file for the design of an interconnection network including a CDC 72 according to the present technique. In step 142, it is determined that a plurality of nodes includes a first node operating in a first clock domain and a second node operating in a second clock domain, where the first and second clock domains have different clock frequencies, different clock phases or both. In step 144, an electronic design file for an interconnection network including at least one CDC 72 according to the present technique is generated. That is, if the network is to connect components in different clock domains, the design for the network can include at least one CDC 72 which may comprise the error comparator 86, 88 and buffers 92, 104 as discussed above.

Figure 9:
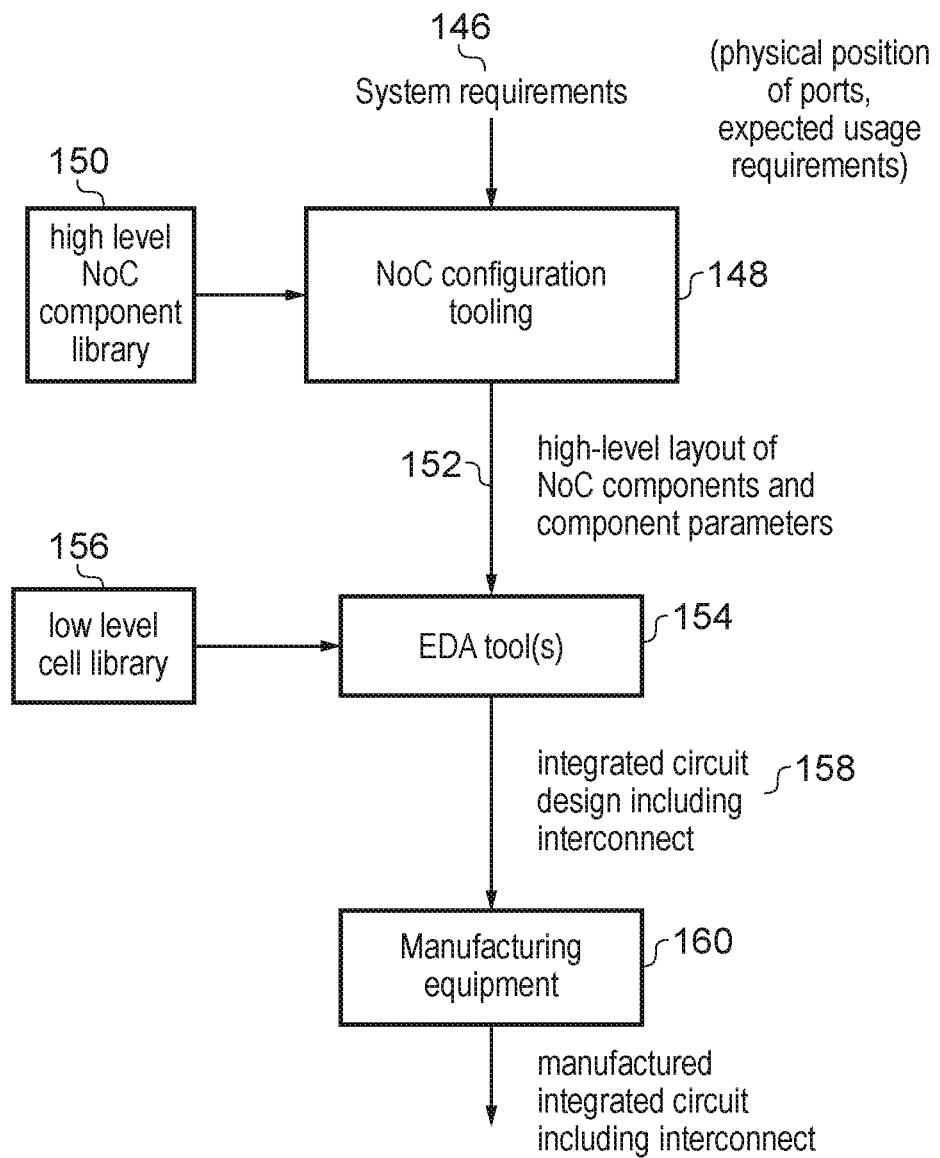
FIG. 9 schematically illustrates design and manufacture of an integrated circuit including an interconnection network.

FIG. 9 schematically illustrates an example of an electronic design process for deigning an electronic design file according to the present invention, which may use automated design techniques to simplify the design process. A system designer or an electronic design tool performing an earlier stage of the design process may specify various system requirements 146, such as the physical position of the ports 46, 48 to be used for the integrated circuits interconnect, and/or expected usage requirements (e.g. which pairs of ports are likely to require communication links between them and the expected level of bandwidth for different pairs of ports depending on expected data traffic or prioritisation of different masters relative to each other). A NoC configuration tooling program 148 executed on a data processing apparatus may use the system requirements, together with a component library 150 providing a high level representation of the various NoC components which can be selected for assembling the NoC, to generate an electronic design file 152 according to the method 140 shown in FIG. 8, which provides a high level layout of the NoC components and specifies various parameters of those components such as parameters for configuring the particular properties of the components.

For example, the component library 150 could specify a range of components, such as the ingress port 46, egress port 48, routers 54, or resizers 70 as discussed above with respect to FIG. 2. For some of these types of component multiple alternative types could be specified in the component library for selection depending on the particular needs of the system requirements. Alternatively a single type of component could be provided but the NoC configuration tooling 148 may specify, as properties of a given component, certain variables which may tune behaviour of a given component of the NoC or control how that component is manufactured. The NoC configuration tooling 148 may determine such requirements based on the system requirements that were input. Hence, one of the components that could be selected by the tooling 148 may be a CDC as discussed above.

The high level layout file 152 generated by the NoC configuration tooling 148 is provided to an electronic design automation (EDA) tool 154 which uses a low level cell library 156 specifying standard cells of integrated circuit components at a more detailed level than the NoC component library 150, and generates an integrated circuit design file 158 which specifies the particular gates or transistors to be generated for the integrated circuit which includes the interconnect designed by the NOC configuration tooling 148. In some cases the EDA 154 may actually comprise a number of tools which gradually iterate the design to produce more and more detailed circuit-level representations. The EDA tools 154 may also carry out timing analysis to check whether the designed circuit would meet its timing requirements (testing for setup and hold violations for example), and may iterate the design if earlier attempts fail the timing analysis. The eventually prepared integrated circuit design represented by the design file 158 is then provided to a manufacturer who uses the design file to control manufacturing equipment 160 to manufacture the integrated circuit with the required connections between transistors in order to implement an integrated circuit including the interconnect.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the technique have been described in detail herein with reference to the accompanying drawings, it is to be understood that the technique is not limited to those precise embodiments, and that various changes and modifications can be effected therein by one skilled in the art without departing from the scope of the technique as defined by the appended claims.

We claim:

1. An apparatus comprising:
a first portion operating in a first clock domain and a second portion operating in a second clock domain;
wherein the first portion comprises a first primary interface and first redundant interface, the first primary interface being configured to receive a primary signal, and the first redundant interface being configured to receive a first checking signal, the first checking signal and the primary signal being separated by a predetermined time delay; and
wherein the second portion comprises a second primary interface and a second redundant interface, the second primary interface being configured to output the primary signal, and the second redundant interface being configured to output a second checking signal;
the apparatus comprising checking circuitry in the second clock domain configured to:
generate the second checking signal based on the primary signal;
perform an error checking procedure based on the first and second checking signals; and supply the second checking signal to the second redundant interface said predetermined time delay after the primary signal is supplied to the second primary interface.

2. The apparatus of claim 1, wherein the second primary interface and the second redundant interface are configured to operate with independent, synchronous clocks.

3. The apparatus of claim 1, comprising:
a delay buffer in the first clock domain configured to store the first checking signal;
wherein the checking circuitry comprises a compare buffer configured to store the second checking signal, and compare circuitry configured to perform the error checking procedure.

4. The apparatus of claim 3, wherein the delay buffer is configured to output the first checking signal in response to a signal from the compare buffer indicating that the second checking signal is available for comparison with the first checking signal.

5. The apparatus of claim 3, wherein the compare buffer is configured to generate a full signal when all entries in the compare buffer are unavailable.

6. The apparatus of claim 3, wherein the compare buffer comprises at least two entries.

7. The apparatus of claim 1, wherein the checking circuitry is configured to generate the second checking signal by copying the primary signal.

8. The apparatus of claim 1, wherein the second checking signal comprises an error check code calculated by the checking circuitry based on the primary signal, and the second checking signal has fewer bits than a portion of the primary signal used to generate the second checking signal.

9. The apparatus of claim 1, wherein the primary signal comprises a data transmission or memory access request.

10. The apparatus of claim 1, comprising a credit return path to transmit a credit return signal from a downstream buffer to an upstream buffer, the credit return signal for controlling transmission timing of a data transmission from the upstream buffer dependent on expected occupancy of the downstream buffer.

11. The apparatus of claim 10, wherein the primary signal comprises the credit return signal.

12. The apparatus of claim 10, wherein the credit return path is configured to transmit the credit return signal from the second clock domain to the first clock domain.

13. The apparatus of claim 12, wherein the credit return signal comprises a first credit return signal identifier; and
the apparatus comprises a redundant credit return path configured to transmit a redundant credit return signal comprising a second credit return signal identifier from the second clock domain to the first clock domain, and a credit comparator in the first clock domain to compare the first credit return signal identifier and the second credit return signal identifier to detect an error in transmission of the credit return signal or the redundant credit return signal.

14. The apparatus of claim 13, wherein the credit signal return identifier comprises an entry identifier of an entry in the downstream buffer that has become available.

15. The apparatus of claim 1, comprising a primary clock domain bridge configured to transmit the primary signal from the first clock domain to the second clock domain, and a redundant clock domain bridge configured to transmit the first checking signal from the first clock domain to the second clock domain.

16. The apparatus of claim 1, wherein the error checking procedure comprises comparing the first and second checking signals and returning an error indication when the first and second checking signals are different.

17. A method for transmitting a primary signal between a first portion operating in a first clock domain and a second portion operating in a second clock domain, the method comprising:
receiving a primary signal at a first primary interface on the first portion, and receiving a first checking signal at a first redundant interface on the first portion, the first checking signal and the primary signal being separated by a predetermined time delay;
outputting the primary signal at a second primary interface on the second portion, and outputting a second checking signal at a second redundant interface on the second portion; wherein checking circuitry in the second clock domain is configured to:
generate the second checking signal based on the primary signal;
perform an error checking procedure based on the first and second checking signals; and
supply the second checking signal to the second redundant interface said predetermined time delay after the primary signal is supplied to the second primary interface.

18. A non-transitory storage medium storing an electronic design file representing a design of an apparatus according to claim 1.

19. A computer-implemented method of generating an electronic design file representing a design of an interconnection network for providing data transfer between a plurality of nodes of an integrated circuit; the method comprising:
in response to identifying that the plurality of nodes include a first node operating in a first clock domain and a second node operating in a second clock domain, generating the electronic design file specifying that the interconnection network comprises a clock domain crossing comprising:
a first portion operating in the first clock domain and a second portion operating in the second clock domain;
wherein the first portion comprises a first primary interface and a first redundant interface, the first primary interface being configured to receive a primary signal, and the first redundant interface being configured to receive a first checking signal, the first checking signal and the primary signal being separated by a predetermined time delay; and
wherein the second portion comprises a second primary interface and a second redundant interface, the second primary interface being configured to output the primary signal, and the second redundant interface being configured to output a second checking signal;
the apparatus comprising checking circuitry in the second clock domain configured to:
generate the second checking signal based on the primary signal;
perform an error checking procedure based on the first and second checking signals; and
supply the second checking signal to the second redundant interface said predetermined time delay after the primary signal is supplied to the second primary interface.

20. A non-transitory recording medium storing a computer program for controlling a data processing apparatus to perform the method of claim 19.

* * * * *